United States Patent
Ecton et al.

(10) Patent No.: US 11,116,084 B2
(45) Date of Patent: Sep. 7, 2021

(54) METHOD, DEVICE AND SYSTEM FOR PROVIDING ETCHED METALLIZATION STRUCTURES

(71) Applicant: INTEL CORPORATION, Santa Clara, CA (US)

(72) Inventors: Jeremy Ecton, Gilbert, AZ (US); Nicholas Haehn, Scottsdale, AZ (US); Oscar Ojeda, Chandler, AZ (US); Arnab Roy, Chandler, AZ (US); Timothy White, Chandler, AZ (US); Suddhasattwa Nad, Chandler, AZ (US); Hsin-Wei Wang, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/634,804

(22) PCT Filed: Sep. 27, 2017

(86) PCT No.: PCT/US2017/053786
§ 371 (c)(1),
(2) Date: Jan. 28, 2020

(87) PCT Pub. No.: WO2019/066813
PCT Pub. Date: Apr. 4, 2019

(65) Prior Publication Data
US 2020/0236795 A1    Jul. 23, 2020

(51) Int. Cl.
*H05K 3/46* (2006.01)
*H01L 21/48* (2006.01)
(Continued)

(52) U.S. Cl.
CPC ....... *H05K 3/4644* (2013.01); *H01L 21/4857* (2013.01); *H01L 23/49822* (2013.01);
(Continued)

(58) Field of Classification Search
CPC ...... H05K 3/4644; H05K 3/181; H05K 3/188; H05K 5/0017
(Continued)

(56) References Cited

U.S. PATENT DOCUMENTS

| | | |
|---|---|---|
| 6,215,191 B1 | 4/2001 | Beroz et al. |
| 2002/0177325 A1 | 11/2002 | Takewaka et al. |

(Continued)

OTHER PUBLICATIONS

International Preliminary Report on Patentability for PCT Application No. PCT/US17/53786, dated Apr. 9, 2020.
(Continued)

*Primary Examiner* — Sherman Ng
(74) *Attorney, Agent, or Firm* — Green, Howard & Mughal LLP.

(57) ABSTRACT

Techniques and mechanisms for providing anisotropic etching of a metallization layer of a substrate. In an embodiment, the metallization layer includes grains of a conductor, wherein a first average grain size and a second average grain size correspond, respectively, to a first sub-layer and a second sub-layer of the metallization layer. The first sub-layer and the second sub-layer each span at least 5% of a thickness of the metallization layer. A difference between the first average grain size and the second average grain size is at least 10% of the first average grain size. In another embodiment, a first condition of metallization processing contributes to grains of the first sub-layer being relatively large, wherein an alternative condition of metallization processing contributes to grains of the second sub-layer being relatively small. A grain size gradient across a thick- (Continued)

ness of the metallization layer facilitates etching processes being anisotropic.

20 Claims, 6 Drawing Sheets

(51) Int. Cl.
    *H01L 23/498*     (2006.01)
    *H05K 3/18*     (2006.01)
    *H05K 5/00*     (2006.01)

(52) U.S. Cl.
    CPC ............ *H05K 3/181* (2013.01); *H05K 3/188* (2013.01); *H05K 5/0017* (2013.01)

(58) Field of Classification Search
    USPC .......................................... 361/748
    See application file for complete search history.

(56) References Cited

U.S. PATENT DOCUMENTS

| | | | |
|---|---|---|---|
| 2014/0357024 A1 | 12/2014 | Guzek | |
| 2015/0061115 A1* | 3/2015 | Chen | H01L 24/11 |
| | | | 257/737 |
| 2015/0333004 A1 | 11/2015 | Jomaa et al. | |
| 2016/0307823 A1* | 10/2016 | Fang | H01L 21/76898 |

OTHER PUBLICATIONS

International Search Report and Written Opinion for International Patent Applicaton No. PCT/US17/53786, dated Jul. 30, 2018.

\* cited by examiner

METHOD, DEVICE AND SYSTEM FOR PROVIDING ETCHED METALLIZATION STRUCTURES

CLAIM OF PRIORITY

This Application is a National Stage Entry of, and claims priority to, PCT Application No. PCT/US17/53786, filed on 27 Sep. 2017 and titled "METHOD, DEVICE AND SYSTEM FOR PROVIDING ETCHED METALLIZATION STRUCTURES", which is incorporated by reference in its entirety for all purposes.

BACKGROUND

1. Technical Field

Embodiments of the invention generally relate to integrated circuit (IC) package and printed circuit board (PCB) technologies and, more particularly but not exclusively, to anisotropic etching to form circuit structures.

2. Background Art

One existing conductor patterning process in the manufacture of substrates uses a dry film resist and wet etch processing which impinges a liquid spray of an etchant onto exposed metal regions. This and some other processing techniques usually use etchants such as solutions of copper chloride ($CuCl_2$), and tend to result in isotropic etching. Isotropic etching—wherein a rate of etching in a vertical direction is substantially the same as a rate of etching in a horizontal direction—presents a fundamental limitation in etch resolution capability.

The demand for enhanced performance and functionality of integrated circuit components continues to increase design and fabrication complexity. Substrates designed for these components typically need to be manufactured with multiple layers of metal on dielectric material. The dimensions of conductive traces are continually shrinking, resulting in an increased demand for precision in metal etching processes. Consequently, there is expected to be a continued premium placed on incremental improvements in the control of how substrate structures are formed.

BRIEF DESCRIPTION OF THE DRAWINGS

The various embodiments of the present invention are illustrated by way of example, and not by way of limitation, in the figures of the accompanying drawings and in which.

DETAILED DESCRIPTION

Embodiments discussed herein variously provide techniques and mechanisms for improved anisotropic etching to form metallization structures of a substrate. In some embodiments, fabrication of such a substrate includes deposition of a conductor to form a metallization layer (e.g., including vias and/or patterned traces), during which one or more deposition characteristics is varied. Variation of said one or more conditions may result in the formation of different sized granules of a conductor at different times. Such variation may contribute to a metallization layer exhibiting a grain size gradient along a thickness dimension. Due to the grain size gradient, a subsequent etching of the metallization layer may be anisotropic—e.g., where etching is relatively fast along the thickness dimension, as compared to concurrent etching in a horizontal direction. Some embodiments are described herein in the context of processing to form metallization structures of a substrate package. However, such description may be extended to additionally or alternatively apply, for example, to the formation of metallization structures of a printed circuit board, a semiconductor substrate or the like.

In another embodiment, a substrate may include features which are indicative of processing such as that described above. For example, a metallization layer of the substrate (e.g., the metallization layer including vias and/or patterned traces) may grain size gradient along a thickness dimension. The technologies described herein may be implemented in one or more electronic devices. Non-limiting examples of electronic devices that may utilize the technologies described herein include any kind of mobile device and/or stationary device, such as cameras, cell phones, computer terminals, desktop computers, electronic readers, facsimile machines, kiosks, netbook computers, notebook computers, internet devices, payment terminals, personal digital assistants, media players and/or recorders, servers (e.g., blade server, rack mount server, combinations thereof, etc.), set-top boxes, smart phones, tablet personal computers, ultra-mobile personal computers, wired telephones, combinations thereof, and the like. Such devices may be portable or stationary. In some embodiments the technologies described herein may be employed in a desktop computer, laptop computer, smart phone, tablet computer, netbook computer, notebook computer, personal digital assistant, server, combinations thereof, and the like. More generally, the technologies described herein may be employed in any of a variety of electronic devices including a substrate which exhibits a metallization grain size gradient.

Figure 1:
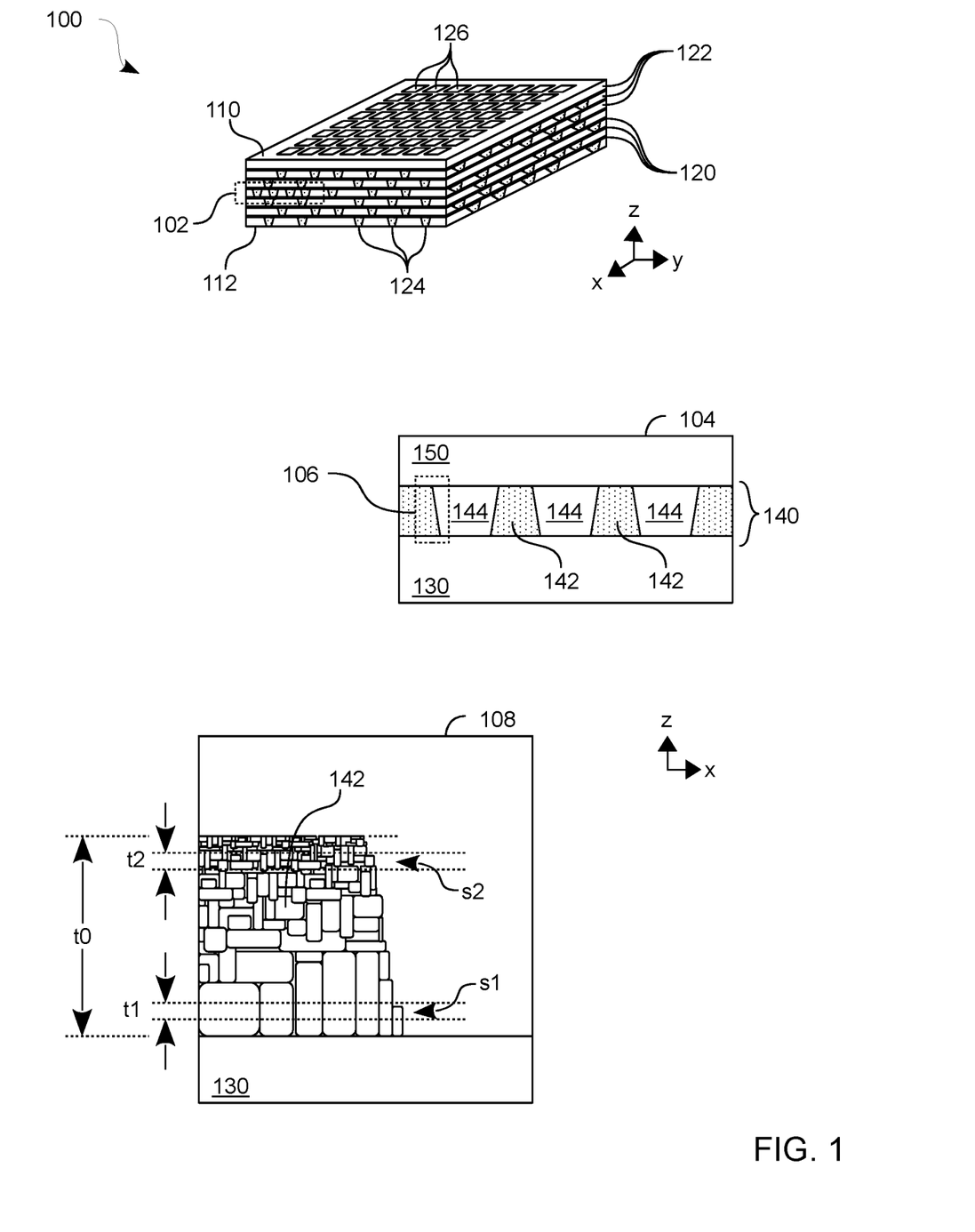
FIG. 1 shows various views illustrating elements of a substrate including metallization structures according to an embodiment.

FIG. 1 illustrates features of a substrate 100 including a metallization grain size gradient in accordance with an embodiment. FIG. 1 also includes cross-sectional detail side views 104, 108 each of a respective region of substrate 100.

Substrate 100 may include one or more artifacts of an anisotropic etching process. Substrate 100 comprises metallization structures and one or more layers of an organic (or alternatively, a semiconductor) insulator material which provide electrical isolation between various ones of said metallization structures—e.g., wherein substrate 100 is a package substrate or a printed circuit board (PCB). A layer of metallization of substrate 100 may include distinct granular structures (or "grains") of various sizes, wherein, along a thickness dimension of the layer, at least a portion of the layer has a grain size gradient. Such a grain size gradient may result from processing that, as compared to conventional techniques, provides improved anisotropic metal etching.

In the example embodiment shown, metallization structures of substrate 100 include horizontal layers 120 of patterned conductive traces—e.g., where layers 120 variously extend along respective xy planes of the xyz coordinate system shown. Such metallization structures may further include vias 124 which variously extend vertically (e.g., along the z-axis) to couple respective ones of layers 120 to each other. Layers 120 and vias 124—e.g., comprising copper, nickel, gold, silver and/or any of various other conductor materials—may facilitate electrical connectivity with one or each of two opposite sides 110, 112 of substrate 100. For example, connectivity with substrate 100 (e.g., through substrate 100) may be facilitated with conductive contacts (e.g., including the illustrative contacts 126 shown) which are variously disposed on one or each of opposite sides 110, 112.

One or more dielectric materials of insulator layers 122 may promote electrical isolation of various ones of layers 120 and/or various ones of vias 124. In an embodiment, insulator layers 122 include any of a variety of dielectric compounds used, for example, in conventional package substrates and/or PCBs. Such compounds may include, but are not limited to, polyimide (PI), polytetrafluoroethylene (PTFE), Ajinomoto Build-up Film (ABF), a liquid crystal polymer (LCP), and polyetheretherketone (PEEK). In some embodiments, insulator layers 122 include a laminate material such as FR4, FR5, bismaleimide triazine (BT) resin, etc. Substrate 100 may have a woven or reinforced core (not shown) or—alternatively—may be coreless, in various embodiments.

Cross-sectional side view 104 shows details of some structures that, for example, may be found in a region 102 of substrate 100. As shown in view 104, substrate 100 may include a first dielectric layer 130 (e.g., one of insulator layers 122) and a metallization layer 140 disposed on first dielectric layer 130. Metallization layer 140 may include one or more metallization structures (such as the illustrative structures 142 shown) that, for example, are variously electrically isolated from one another by insulator portions 144.

Structures 142 may include, for example, various ones of vias 124 and/or various patterned traces of layers 120. In some embodiments, metallization layer 140 has disposed thereon one or more additional insulator layers (such as the illustrative second dielectric layer 150 shown)—e.g., wherein dielectric layers 130, 150 are on opposite sides of metallization layer 140. A dielectric compound of insulator portions 144 may be integral with a dielectric of first dielectric layer 130 (and/or with a dielectric of second dielectric layer 150), in some embodiments.

Some or all of the structures 142 of metallization layer 140 may exhibit a grain size gradient along a thickness (z-axis) dimension. For example, cross-sectional side view 108 shows in more detail an example of a grain size gradient in the region 106 shown. As illustrated in view 108, metallization layer 140 may have a z-axis thickness t0, where sub-layers of metallization layer 140 (e.g., including the illustrative sub-layers s1, s2 shown) each span a different respective region along thickness t0. Sub-layer s1 may span a first vertical range having a thickness t1—e.g., where sub-layer s2 spans a different vertical range having a thickness t2. In such an embodiment, a first average size of grains in sub-layer s1 may differ from a second average size of grains in sub-layer s2 by some non-trivial amount—e.g., wherein the grain size difference is at least 10% (and in some embodiments, at least 20%) of one of the first average size and the second average size.

As used herein, "grain size" refers herein to a one-dimensional span of a grain, as measured along some reference axis (e.g., the z-axis). In the example embodiment shown by view 108, grains in sub-layer s1 have an average size (e.g., vertical height) which is greater than t1. By contrast, grains in sub-layer s2 have a corresponding average size which is closer to, and may be smaller than, t2. By way of illustration and not limitation, sub-layer s1 and sub-layer s2 may each spans at least a respective 5% thickness t0, wherein grains which each extend at least partially in sub-layer s1 have a first average grain size g1. In such an embodiment, grains which each extend at least partially in sub-layer s2 may have a second average grain size g2—e.g., wherein a difference (g1−g2) between the average grain sizes is at least 10% of the first average grain size g1. However, any of a variety of other grain size gradients may be provided with metallization layer 140, in different embodiments.

Figure 2:
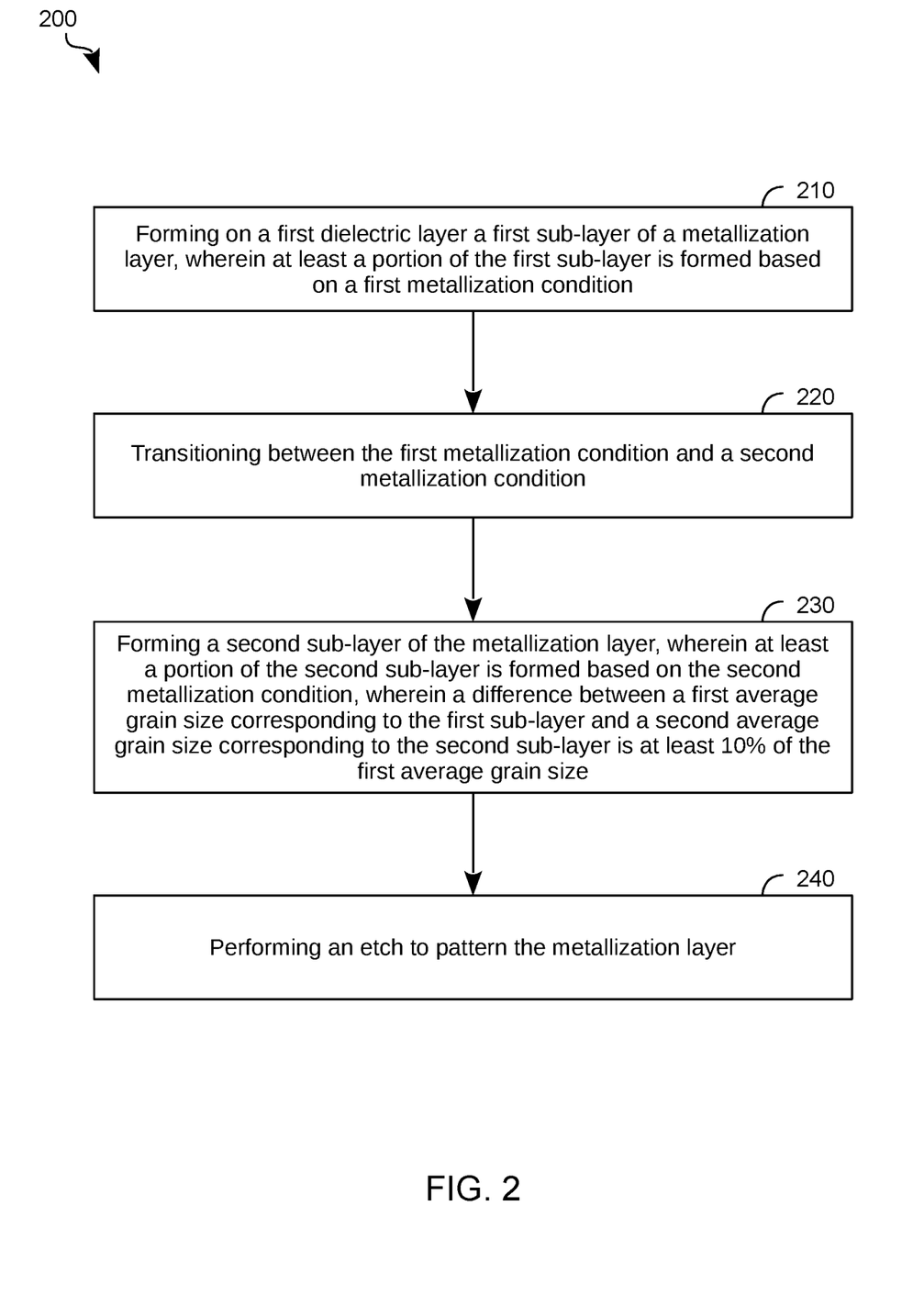
FIG. 2 is a flow diagram illustrating elements of a method for providing metallization structures according to an embodiment.

FIG. 2 shows features of a method 200 to provide patterned metallization structures of a substrate according to an embodiment. Method 200 may include processes to fabricate some or all of metallization structures 140, for example. To illustrate certain features of various embodiments, method 200 is described herein with reference to structures shown in FIG. 3. However, any of a variety of additional or alternative structures may be fabricated according to method 200, in different embodiments.

As shown in FIG. 2, method 200 may include (at 210) forming, on a first dielectric layer, a first sub-layer of a metallization layer, wherein at least a portion of the first sub-layer is formed based on a first metallization condition. For example, referring now to FIG. 3, cross-sectional side views are shown for respective stages 300-302 of processing to provide a grain size gradient of a substrate according to an embodiment. As shown at stage 300, a side 312 of a dielectric layer 310 (e.g., one of insulator layers 122) may be subjected to a deposition 320 of a conductor such as copper. Deposition 320 (at 210, for example) may result in the growth of metal grains 330 at least on an exposed portion of side 312, wherein a condition (also referred to herein as a "metallization condition") of deposition 320 determines at least in part the various sizes of grains 330. For example, deposition 320 may include performing one of an electroplating process, an electroless process, and a metal foil application process.

A metallization condition may include one or more characteristics of a mechanism by which metal is deposited, at a particular time or in a particular time duration, on the dielectric layer. Examples of such characteristics include, but are not limited to, a current, voltage, chemical composition, temperature, deposition technique (e.g., electroplating versus electroless versus rolled foil), and a degree or type of energy being applied (e.g., ultrasound, radiation, etc.). In some embodiments, a metallization condition includes a degree or type of such a characteristic and/or a degree or type of change (e.g., first order, second order, etc.) to such a characteristic.

Method 200 may further comprise, at 220, transitioning between the first metallization condition and a second metallization condition (e.g., the transitioning after formation of the first sub-layer). Such a transition may include changing—e.g., by degree or type—one or more characteristics of metallization processing. By way of illustration and not limitation, the transitioning at 220 may include changing a level of an electroplating current and/or adding an accelerator compound (or alternatively a suppressor compound) to an electroplating bath solution. In some embodiments, the transitioning at 220 includes changing between different types of deposition processes—e.g., between different ones of an electroplating process type, an electroless process type and a foil application process type. As a result, forming a metallization layer according to method 200 may comprise performing a sequence which includes, for example, an electroplating stage and an electroless deposition stage.

Method 200 may further include, at 230, forming a second sub-layer of the metallization layer, wherein at least a portion of the second sub-layer is formed based on the second metallization condition. One or both of the first sub-layer and the second sub-layer may, for example, span at least 5% (e.g., at least 10% and, in some embodiments, at least 20%) of an overall thickness of the metallization layer. In such an embodiment, a difference between a first average grain size corresponding to the first sub-layer and a second average grain size corresponding to the second sub-layer may be at least 10% of the first average grain size—e.g., wherein the second average grain size is smaller than the first average grain size.

A metallization condition may comprise one or more characteristics—e.g., including magnitude and/or frequency—of a current (or voltage) used to deposit metal in an electroplating process, for example. Alternatively or in addition the metallization condition may include a chemical composition, temperature or other characteristic of a bath solution used for such electroplating. Continuous changing of a metallization condition may contribute to some or all of a grain size gradient being continuous along a thickness of the metallization layer. Alternatively or in addition, stepwise changing of the metallization condition may contribute to a grain size gradient having one or more discrete, non-continuous changes in grain size.

In one such embodiment, a relatively early electroplating stage may be performed using a current which is in a range of 0.1 to 20 amps per square decimeter (amp/dm$^2$, or ASD)—e.g., wherein the current is in a range of 0.025 ASD to 5.0 ASD. The earlier electroplating stage may result in the formation of grains which are relatively small—e.g., as compared to grains formed by subsequent deposition. In such an embodiment, the electroplating current may be subsequently changed—e.g., decreased by at least 5% (and in some embodiments, at least 10%). Such a decrease in electroplating current may facilitate the formation of relatively large grains. In other embodiments, electroplating current may be increased during a metallization process—e.g., starting relatively low on an ASD scale to form relatively large grains, and then transitioning toward a higher end of the ASD scale to form smaller grains thereon. Changing an electroplating current may take place in one or more step-wise increments or, for example, continuously throughout some or all of a metallization process.

Alternatively or in addition, a change to a metallization condition may include adding one or more compounds, during or between stages of electroplating, to a bath solution in which such electroplating takes place. Such one or more compounds may include, for example, an accelerator to form an electroactive species that promotes a rate of plating. Examples of an accelerator include any of a variety of small polar molecules (e.g., including, but not limited to, various thiole compounds and disulfide compounds) which, for example, are adapted from conventional electroplating techniques. Alternatively or in addition, such one or more compounds may include a suppressor to combine with chloride (or other) ions to mitigate a rate of plating. Examples of a suppressor include any of various large non polar molecules (e.g., such as polyalkylene glycol, polyethylene glycol or other such glycol compounds) which, for example, are adapted from conventional electroplating techniques. In an embodiment, changing a metallization condition includes changing a ratio of the respective concentrations of an accelerator and a suppressor in a bath. For example, an increased accelerator to suppressor ratio may contribute to an increased rate of electroplating, whereas a decreased accelerator to suppressor ratio may contribute to a decreased rate of electroplating.

Referring again to FIG. 3, the forming at 230 may include performance of a deposition 322 shown at stage 301 to further form grains 340 of a conductor material on other previously-formed grains 332 (which, for example, include grains 330). Deposition 320 may take place based at least in part on a second metallization condition which, for example, is a result of the transitioning at 220. Deposition 322 may differ from deposition 320 with respect to at least one metallization condition. In the example embodiment shown, deposition 322 results in the formation of grains which are relatively small, as compared to some or all of grains 332.

Figure 3:
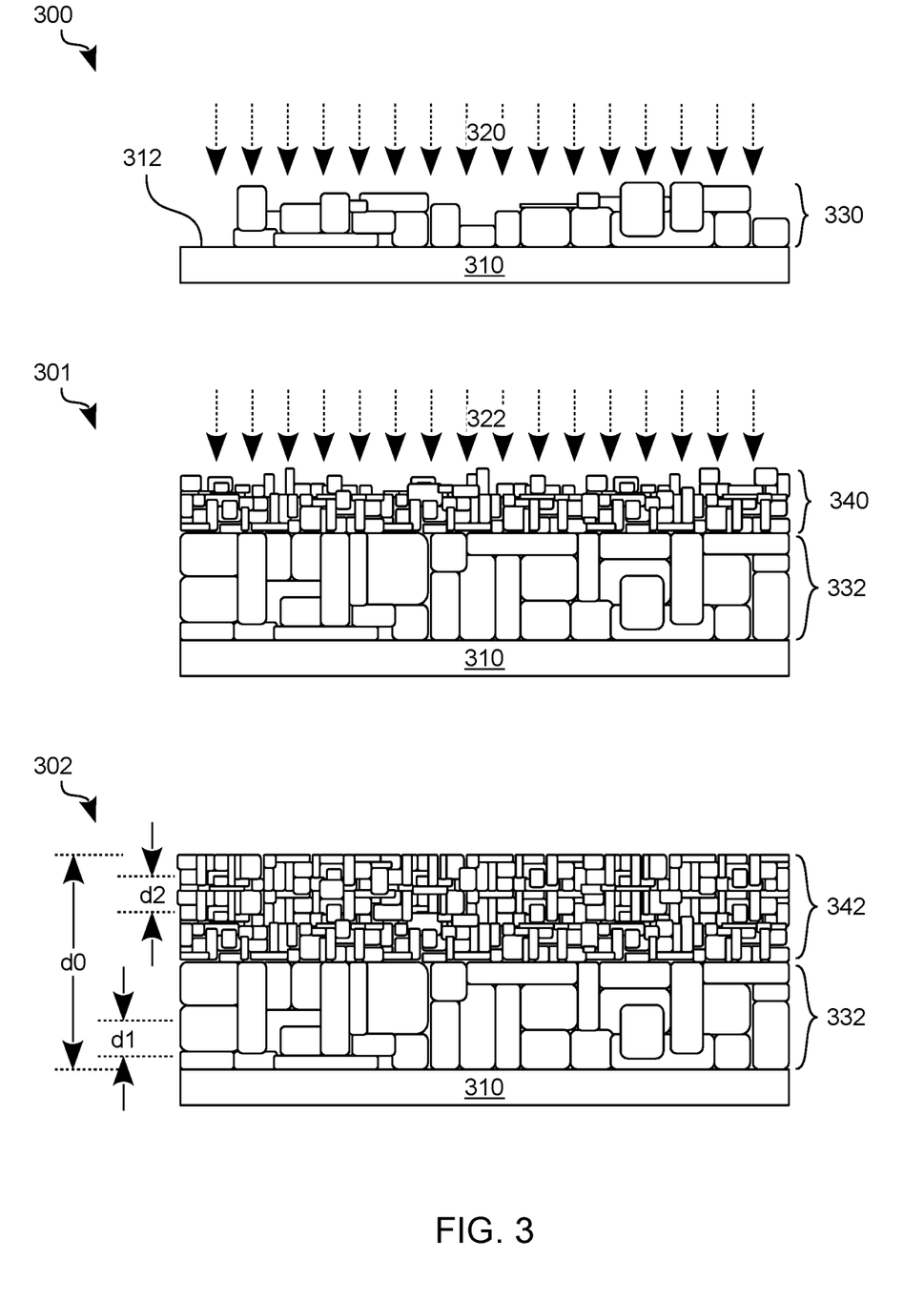
FIG. 3 shows cross-sectional diagrams each illustrating structures at a respective stage of a metallization process according to an embodiment.

In some embodiments, deposition 322 continues until formation of the metallization layer is completed. Alternatively, one or more subsequent changes to metallization conditions may take place to provide further changes to average grain size across the metallization layer. For example, the metallization layer formed by method 200 may further comprise a third sub-layer (e.g., also spanning at least 5% of the thickness), wherein a third average grain size corresponds to the third sub-layer. In such an embodiment, a difference between the third average grain size and the second average grain size may be at least 10% of the third average grain size.

As shown at stage 302, a metallization layer (such as that formed by method 200) may include relatively large grains 332 and relatively small grains 342 at different respective levels along an overall thickness d0 of the metallization layer. A first sub-layer and a second sub-layer of the metallization layer may have respective thicknesses (such as the illustrative thicknesses d1, d2 shown). For example, thicknesses d1, d2 may be equal to each other and/or may each span at least 5% (and in some embodiments, at least 10%) of the overall thickness d0. Although some embodiments are not limited in this regard, thickness d0 may be in a range between 3 nm and 1000 um (e.g., in a range of 1 um to 100 um), for example. In such an embodiment, an maximum average grain size (e.g., thickness) may be 750 um—e.g., wherein a minimum average grain size is equal to or more than 1 nm. However, such dimensions are merely illustrative and may differ according to implementation-specific details, in various embodiments.

The grains which each extend at least in part in the first sub-layer may have a corresponding first average grain size, wherein the grains which each extend at least in part in the second sub-layer have a corresponding second average grain size. In such an embodiment, a difference between the first average grain size and the second average grain size may be at least 10% (and in some embodiments, at least 20%) of the first average grain size. Alternatively or in addition, such a difference may be at least equal to some minimum fraction—e.g., at least two percent (2%)—of the overall thickness of the metallization layer. In some embodiments, the first sub-layer and second sub-layer of the metallization layer adjoin one another. Alternatively or in addition, at least one of the first sub-layer and second sub-layer may extend to an exterior surface portion of the metallization layer. Together, the first sub-layer and second sub-layer may span the entire thickness of the metallization layer or, alternatively, only a subset of the thickness.

The example processing illustrated by stages 300-301 may result in a gradient which has a substantially step-wise transition between grains of a first average size and other grains of a second average size that is substantially smaller than the first average grain size. By way of illustration and not limitation, the first sub-layer may span at least 30% of the thickness—e.g., wherein the second sub-layer spans at least 30% of the thickness. In such an embodiment, the difference between the first average grain size and the second average grain size may be at least 30% of the first average grain size. In some embodiments, a grain size gradient of the metallization layer includes multiple step-wise changes. Alternatively or in addition, a grain size gradient may be continuous along some or all of the thickness of a metallization layer.

Although some embodiments are not limited in this regard, method 200 may additionally or alternatively include performing an etch (at 240) to pattern a metallization layer such as that formed by operations 210, 220, 230. For example, referring now to FIG. 4, cross-sectional side views are shown for respective stages 400-402 of processing, according to an embodiment, to etch a metal layer which has a grain size gradient. The etching at 240 may include one or more features of the processing illustrated by stages 400-402.

Figure 4:
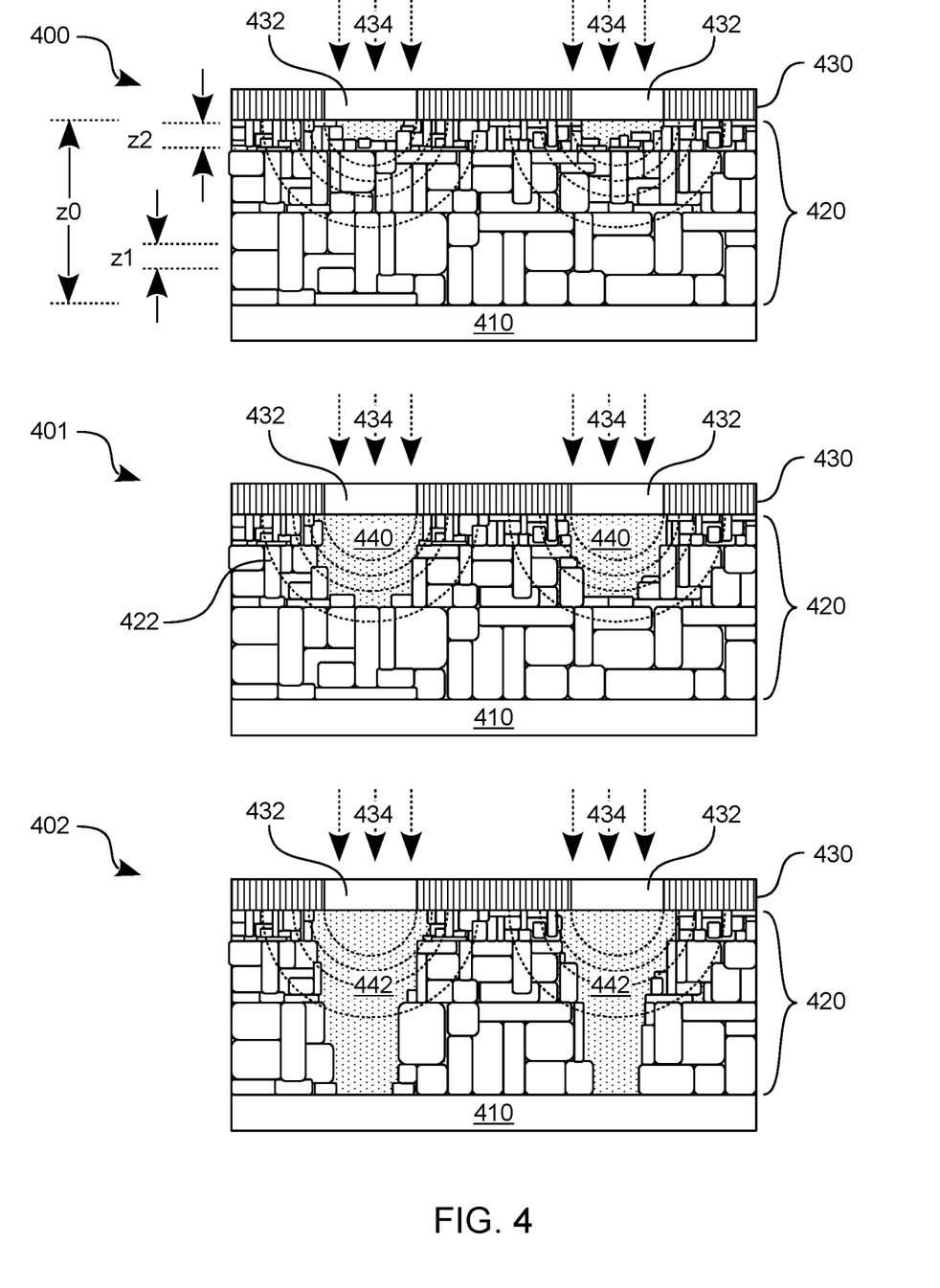
FIG. 4 shows cross-sectional diagrams each illustrating structures at a respective stage of a substrate manufacture process according to an embodiment.

As shown at stage 400, metallization layer 420 may be on a side of a dielectric layer 410. Metallization layer 420 may have a grain size gradient—e.g., wherein metallization layer 420 includes some or all of the features of the metallization layer shown at stage 302. In the example embodiment shown, metallization layer 420 has an overall thickness z0—e.g., wherein a first sub-layer and a second sub-layer of metallization layer 420 have the respective thicknesses z1, z2 shown. Thicknesses z1, z2 may each span at least 5% of z0—e.g., wherein thicknesses z1, z2 are equal to each other. The grains of metallization layer 420 which extend at least in part in the first sub-layer may have a first average size, wherein the grains which extend at least in part in the second sub-layer have a second average size. In such an embodiment, a difference between the first average grain size and the second average grain size is at least 10% (e.g., at least 20%) of the first average grain size. An inverse gradient—with relatively fine grains at the bottom and larger grains at the top—may be instead utilized in some embodiments. FIG. 4 also shows dashed lines 422 which illustrate successive distances to which isotropic etching might otherwise extend according to conventional etching techniques—e.g., but for the presence of the grain size gradient of metallization layer 420.

A patterned mask 430 may be formed on metallization layer 420—e.g., the patterned mask 430 having holes 432 formed therein. Holes 432 may expose surface portions of metallization layer 420 which are underlying patterned mask 430. In an embodiment, exposed surface portions of metallization layer 420 may be subjected to a wet etching 434 through holes 432. Due at least in part to a grain size gradient of metallization layer 420, etching 434 result in an anisotropic formation of etched structures. More particularly, grain boundaries may be relatively more inhibitive of etching, as compared to the contiguous metallurgical structure within any one grain. As compared to etching along a vertical direction (e.g., along the thickness dimension shown), etching along a horizontal direction may encounter relatively minor (if any) changes to the density of grain boundaries. As a result, a rate of etching along the vertical direction may increase over time, at least as compared to a rate of etching along a more horizontal direction.

For example, etching 434 may result, at stage 401, in recesses 440 being formed in metallization layer 420, the recesses 440 each under a respective one of holes 432. At stage 401, anisotropic etching is indicated in part by recesses 440 each being deeper, along a line of direction for thickness z0, than they are wide (or long). As shown at stage 402, the anisotropic shape of recesses 440 may become more exaggerated with further etching. For example, etching 434 may continue until one or more holes (such as holes 442) extend each from a top side of metallization layer 420 to a bottom side of metallization layer 420. Holes 442 may have a height-to-width ratio—and/or a height-to-length ratio—which is larger than that provided by isotropic etching. Alternatively or in addition, holes 442 may be relatively more constrained each to a region under a corresponding on of holes 432—e.g., wherein holes 442 exhibit less undercutting beneath mask 430.

In an embodiment, metallization layer 420 is to form part of a package substrate of a circuit device that, for example, is to also include some or all of dielectric layer 410. For example, a core of such a package substrate may include dielectric layer 410 and metallization layer 420. In another embodiment, a PCB is to include some or all of dielectric layer 410 and metallization layer 420.

Figure 5:
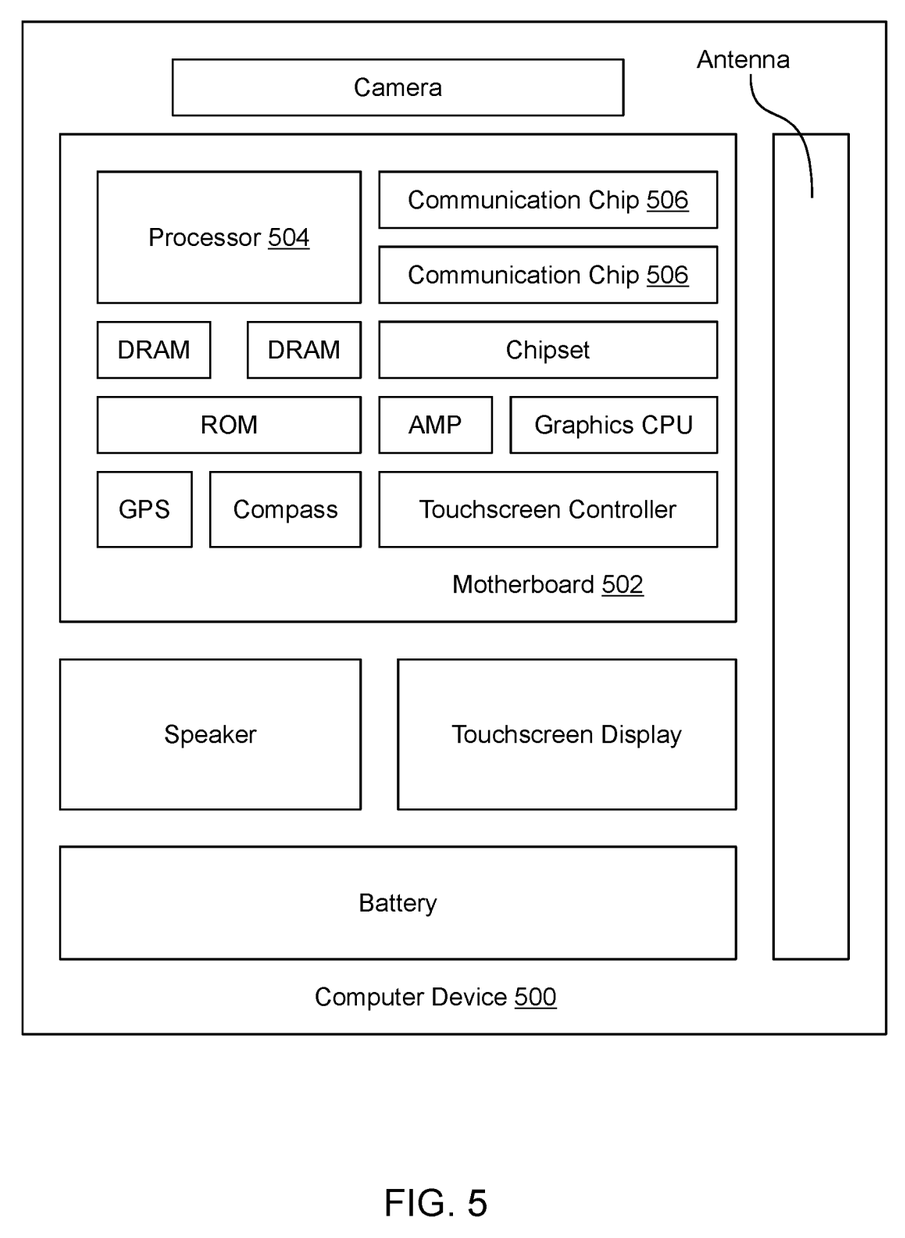
FIG. 5 is a functional block diagram illustrating a computing device in accordance with one embodiment.

FIG. 5 illustrates a computing device 500 in accordance with one embodiment. The computing device 500 houses a board 502. The board 502 may include a number of components, including but not limited to a processor 504 and at least one communication chip 506. The processor 504 is physically and electrically coupled to the board 502. In some implementations the at least one communication chip 506 is also physically and electrically coupled to the board 502. In further implementations, the communication chip 506 is part of the processor 504.

Depending on its applications, computing device 500 may include other components that may or may not be physically and electrically coupled to the board 502. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 506 enables wireless communications for the transfer of data to and from the computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 506 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 500 may include a plurality of communication chips 506. For instance, a first communication chip 506 may be dedicated to shorter range wireless communications such as Wi-Fi and Bluetooth and a second communication chip 506 may be dedicated to longer range wireless communications such as GPS, EDGE, GPRS, CDMA, WiMAX, LTE, Ev-DO, and others.

The processor 504 of the computing device 500 includes an integrated circuit die packaged within the processor 504. The term "processor" may refer to any device or portion of a device that processes electronic data from registers and/or memory to transform that electronic data into other electronic data that may be stored in registers and/or memory. The communication chip 506 also includes an integrated circuit die packaged within the communication chip 506.

In various implementations, the computing device 500 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 500 may be any other electronic device that processes data.

Some embodiments may be provided as a computer program product, or software, that may include a machine-readable medium having stored thereon instructions, which may be used to program a computer system (or other electronic devices) to perform a process according to an embodiment. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

Figure 6:
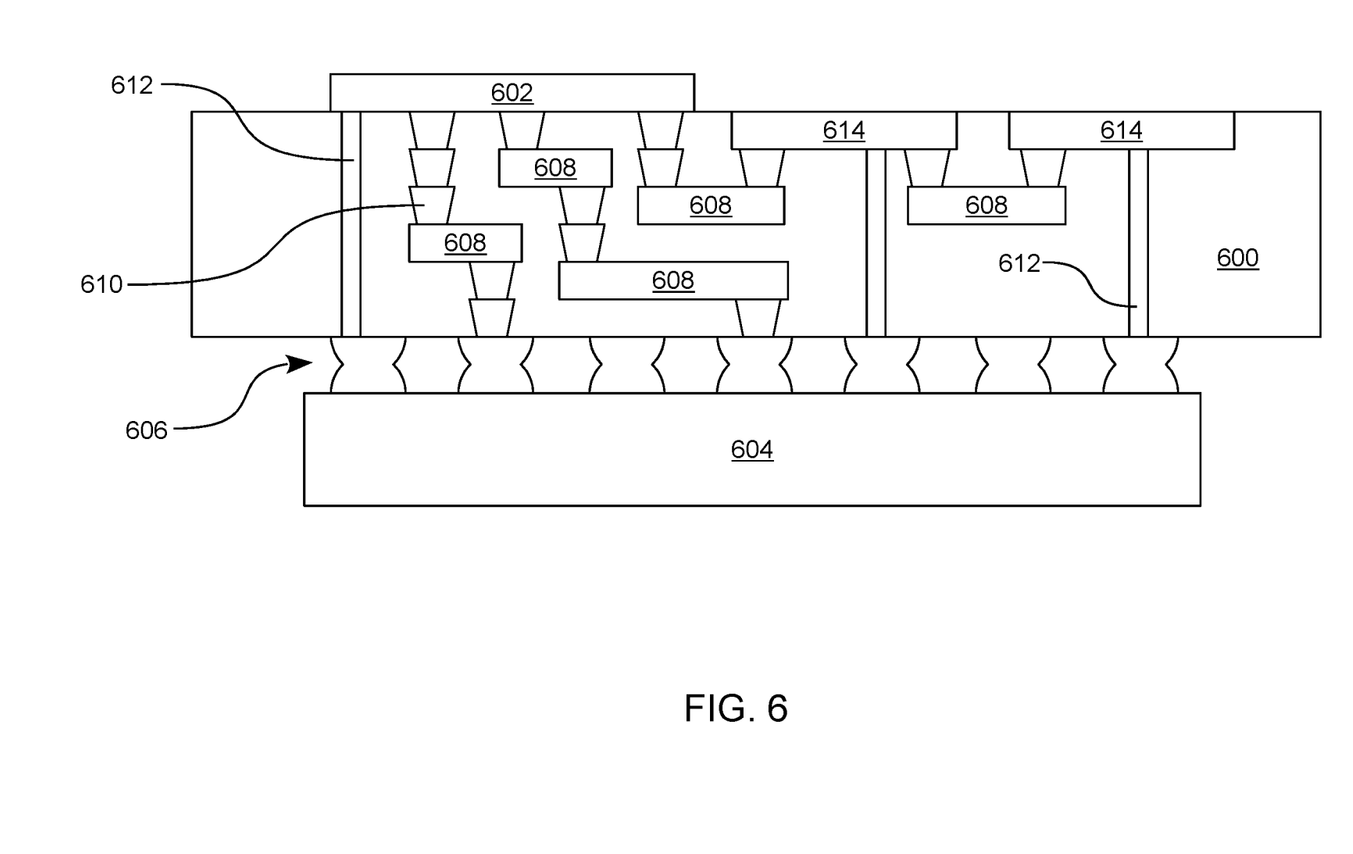
FIG. 6 is a cross-sectional view of an interposer implementing one or more embodiments.

FIG. 6 illustrates an interposer 600 that includes one or more embodiments. The interposer 600 is an intervening substrate used to bridge a first substrate 602 to a second substrate 604. The first substrate 602 may be, for instance, an integrated circuit die. The second substrate 604 may be, for instance, a memory module, a computer motherboard, or another integrated circuit die. Generally, the purpose of an interposer 600 is to spread a connection to a wider pitch or to reroute a connection to a different connection. For example, an interposer 600 may couple an integrated circuit die to a ball grid array (BGA) 606 that can subsequently be coupled to the second substrate 604. In some embodiments, the first and second substrates 602, 604 are attached to opposing sides of the interposer 600. In other embodiments, the first and second substrates 602, 604 are attached to the same side of the interposer 600. And in further embodiments, three or more substrates are interconnected by way of the interposer 600.

The interposer 600 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 608 and vias 610, including but not limited to through-silicon vias (TSVs) 612. The interposer 600 may further include embedded devices 614, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 600. In accordance with some embodiments, apparatuses or processes disclosed herein may be used in the fabrication of interposer 600.

In one implementation, a circuit device comprises a first layer including a dielectric, and a metallization layer disposed on the first layer, wherein a first average grain size corresponds to a first sub-layer of the metallization layer which spans at least 5% of a thickness of the metallization layer, a second average grain size corresponds to a second sub-layer of the metallization layer which spans at least 5% of the thickness of the metallization layer, the second average grain size smaller than the first average grain size, and a difference between the first average grain size and the second average grain size is at least 10% of the first average grain size.

In one embodiment, a package substrate of the circuit device includes the metallization layer. In another embodiment, a core of the package substrate includes the metallization layer. In another embodiment, the first sub-layer adjoins the second sub-layer. In another embodiment, the metallization layer further comprises a third sub-layer, wherein the third sub-layer spans at least 5% of the thickness of the metallization layer, a third average grain size corresponds to the third sub-layer, and a difference between the third average grain size and the second average grain size is at least 10% of the third average grain size. In another embodiment, the first sub-layer is adjacent to a first side of the metallization layer. In another embodiment, the second sub-layer is adjacent to a second side of the metallization layer. In another embodiment, the first sub-layer spans at least 30% of the thickness of the metallization layer, the second sub-layer spans at least 30% of the thickness of the metallization layer, and the difference between the first average grain size and the second average grain size is at least 30% of the first average grain size.

In another implementation, a method comprises forming on a first dielectric layer a first sub-layer of a metallization layer, wherein at least a portion of the first sub-layer is formed based on a first metallization condition, transitioning between the first metallization condition and a second metallization condition, and forming a second sub-layer of the metallization layer, wherein at least a portion of the second sub-layer is formed based on the second metallization condition. The first sub-layer spans at least 5% of a thickness of the metallization layer, a first average grain size corresponds to the first sub-layer of the metallization layer, the second sub-layer spans at least 5% of the thickness of the metallization layer, a second average grain size corresponds to a second sub-layer of the metallization layer, the second average grain size smaller than the first average grain size, and a difference between the first average grain size and the second average grain size is at least 10% of the first average grain size.

In one embodiment, a package substrate includes the metallization layer. In another embodiment, a core of the package substrate includes the metallization layer. In another embodiment, the first sub-layer adjoins the second sub-layer. In another embodiment, the method further comprises forming a third sub-layer of the metallization layer, wherein a third average grain size corresponds to the third sub-layer, and wherein a difference between the third average grain size and the second average grain size is at least 10% of the third average grain size. In another embodiment, the first sub-layer is adjacent to a first side of the metallization layer. In another embodiment, the second sub-layer is adjacent to a second side of the metallization layer. In another embodiment, the first sub-layer spans at least 30% of the thickness of the metallization layer, the second sub-layer spans at least 30% of the thickness of the metallization layer, and the difference between the first average grain size and the second average grain size is at least 30% of the first average grain size. In another embodiment, the first metallization condition includes a first level of an electroplating current wherein the second metallization condition includes a second level of the electroplating current. In another embodiment, the first metallization condition includes a first chemical composition of an electroless plating solution, and wherein the second metallization condition includes a second chemical composition of the electroless plating solution. In another embodiment, the first metallization condition includes an electroplating process, and wherein the second metallization condition includes an electroless deposition process.

In another implementation, a system comprises a circuit device comprising a first layer including a dielectric, and a metallization layer disposed on the first layer, wherein a first average grain size corresponds to a first sub-layer of the metallization layer which spans at least 5% of a thickness of the metallization layer, a second average grain size corresponds to a second sub-layer of the metallization layer which spans at least 5% of the thickness of the metallization layer, the second average grain size smaller than the first average grain size, and a difference between the first average grain size and the second average grain size is at least 10% of the first average grain size. The system further comprises a display device coupled to the circuit device, the display device to display an image based on a signal communicated with the circuit device.

In one embodiment, a package substrate of the circuit device includes the metallization layer. In another embodiment, a core of the package substrate includes the metallization layer. In another embodiment, the first sub-layer adjoins the second sub-layer. In another embodiment, the metallization layer further comprises a third sub-layer, wherein the third sub-layer spans at least 5% of the thickness of the metallization layer, a third average grain size corresponds to the third sub-layer, and a difference between the third average grain size and the second average grain size is at least 10% of the third average grain size. In another embodiment, the first sub-layer is adjacent to a first side of the metallization layer. In another embodiment, the second sub-layer is adjacent to a second side of the metallization layer. In another embodiment, the first sub-layer spans at least 30% of the thickness of the metallization layer, the second sub-layer spans at least 30% of the thickness of the metallization layer, and the difference between the first average grain size and the second average grain size is at least 30% of the first average grain size.

Techniques and architectures for providing metallization structures of a substate are described herein. In the above description, for purposes of explanation, numerous specific details are set forth in order to provide a thorough understanding of certain embodiments. It will be apparent, however, to one skilled in the art that certain embodiments can be practiced without these specific details. In other instances, structures and devices are shown in block diagram form in order to avoid obscuring the description.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

Some portions of the detailed description herein are presented in terms of algorithms and symbolic representations of operations on data bits within a computer memory. These algorithmic descriptions and representations are the means used by those skilled in the computing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the discussion herein, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Certain embodiments also relate to apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs) such as dynamic RAM (DRAM), EPROMs, EEPROMs, magnetic or optical cards, or any type of media suitable for storing electronic instructions, and coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear from the description herein. In addition, certain embodiments are not described with reference to any particular programming language. It will be appreciated that a variety of programming languages may be used to implement the teachings of such embodiments as described herein.

Besides what is described herein, various modifications may be made to the disclosed embodiments and implementations thereof without departing from their scope. Therefore, the illustrations and examples herein should be construed in an illustrative, and not a restrictive sense. The scope of the invention should be measured solely by reference to the claims that follow.

What is claimed is:

1. A circuit device comprising:
a first layer comprising a dielectric; and
a second layer of a metal on the first layer, the second layer comprising:
a first sub-layer of the metal, the first sub-layer comprising a first average grain size, wherein the first sub-layer spans at least 5% of a thickness of the second layer;
a second sub-layer of the metal, the second sub-layer comprising a second average, grain size wherein the second sub-layer of the metallization layer which spans at least 5% of the thickness of the metallization second layer, the second average grain size smaller than the first average grain size; and
a third sub-layer of the metal, the third sub-layer comprising a third average grain size, wherein the third sub-layer spans at least 5% of the thickness of the second layer;
wherein:
a first difference between the first average grain size and the second average grain size is at least 10% of the first average grain size; and
a second difference between the third average grain size and the second average grain size is at least 10% of the third average grain size.

2. The circuit device of claim 1, wherein a package substrate of the circuit device comprises the second layer.

3. The circuit device of claim 2, wherein a core of the package substrate comprises the second layer.

4. The circuit device of claim 1, wherein the first sub-layer adjoins the second sub-layer.

5. The circuit device of claim 1, wherein the first sub-layer is adjacent to a first side of the second layer.

6. The circuit device of claim 5, wherein the second sub-layer is adjacent to a second side of the second layer.

7. The circuit device of claim 1, wherein the first sub-layer spans at least 30% of the thickness of the second layer, the second sub-layer spans at least 30% of the thickness of the second layer, and the difference between the first average grain size and the second average grain size is at least 30% of the first average grain size.

8. The circuit device of claim 1, wherein the second layer forms a first hole structure which extends through the second layer, wherein a first width of the first hole structure at the first sub-layer is smaller than a second width of the first hole structure at the second sub-layer.

9. The circuit device of claim 8, wherein the second layer further forms a second hole structure which extends through the second layer, wherein a first portion of the first sub-layer and a second portion of the second sub-layer each extend both to the first hole structure and to the second hole structure, wherein the first portion comprises the first average grain size, and wherein the second portion comprises the second average grain size.

10. A method comprising:
forming on a first dielectric layer a first sub-layer of a second layer of a metal, wherein at least a portion of the first sub-layer is formed based on a first metallization condition;
forming a second sub-layer of the second layer, wherein at least a portion of the second sub-layer is formed based on a second metallization condition; and
performing an etch through the second sub-layer toward the first sub-layer;
wherein:
the first sub-layer spans at least 5% of a thickness of the second layer;
the second sub-layer spans at least 5% of the thickness of the second layer;
a first average grain size of the first sub-layer is larger than a second average grain size of the second sub-layer, the second average grain size smaller than the first average grain size; and
a difference between the first average grain size and the second average grain size is at least 10% of the first average grain size.

11. The method of claim 10, wherein a package substrate comprises the second layer.

12. The method of claim 11, wherein a core of the package substrate comprises the second layer.

13. The method of claim 10, wherein the first sub-layer adjoins the second sub-layer.

14. The method of claim 10, further comprising:
forming a third sub-layer of the second layer, wherein a difference between a third average grain size of the third sub-layer and the second average grain size is at least 10% of the third average grain size.

15. The method of claim 10, wherein the first sub-layer is adjacent to a first side of the second layer.

16. The method of claim 10, wherein the first sub-layer spans at least 30% of the thickness of the second layer, the second sub-layer spans at least 30% of the thickness of the second layer, and the difference between the first average grain size and the second average grain size is at least 30% of the first average grain size.

17. The method of claim 10, wherein the first metallization condition comprises a first level of an electroplating current wherein the second metallization condition comprises a second level of the electroplating current.

18. The method of claim 10, wherein the first metallization condition comprises a first chemical composition of an electroless plating solution, and wherein the second metallization condition comprises a second chemical composition of the electroless plating solution.

19. The method of claim 10, wherein the first metallization condition comprises an electroplating process, and wherein the second metallization condition comprises an electroless deposition process.

20. A system comprising:
a circuit device comprising:
a first layer comprising a dielectric; and
a second layer of a metal on the first layer, the second layer comprising:
a first sub-layer of the metal, the first sub-layer comprising a first average grain size, wherein the first sub-layer spans at least 5% of a thickness of the second layer;
a second sub-layer of the metal, the second sub-layer comprising a second average grain size, wherein the second sub-layer spans at least 5% of the thickness of the second layer, the second average grain size smaller than the first average grain size; and
a third sub-layer of the metal, the third sub-layer comprising a third average grain size, wherein the third sub-layer spans at least 5% of the thickness of the second layer;
wherein:

a first difference between the first average grain size and the second average grain size is at least 10% of the first average grain size; and a second difference between the third average grain size and the second average grain size is at least 10% of the third average grain size; and a circuit board coupled to the circuit device, the circuit board to communicate a signal a metallization structure of the second layer.

\* \* \* \* \*